United States Patent
Meng

(10) Patent No.: US 8,324,965 B2
(45) Date of Patent: Dec. 4, 2012

(54) FINAL STAGE THREE-WAY POWER COMBINING AMPLIFYING CIRCUIT APPLIED TO POWER AMPLIFIER OF MOBILE COMMUNICATIONS BASE STATION SYSTEM

(75) Inventor: Qingnan Meng, Wuhan (CN)

(73) Assignee: Wuhan Gewei Electronic Technology Co., Ltd. (CN)

( * ) Notice: Subject to any disclaimer, the term of this patent is extended or adjusted under 35 U.S.C. 154(b) by 87 days.

(21) Appl. No.: 12/996,066

(22) PCT Filed: Jan. 15, 2010

(86) PCT No.: PCT/CN2010/070204
§ 371 (c)(1),
(2), (4) Date: Dec. 3, 2010

(87) PCT Pub. No.: WO2010/118645
PCT Pub. Date: Oct. 21, 2010

(65) Prior Publication Data
US 2011/0080215 A1    Apr. 7, 2011

(30) Foreign Application Priority Data
Apr. 14, 2009   (CN) .......................... 2009 1 0061603

(51) Int. Cl.
*H03F 3/68* (2006.01)
(52) U.S. Cl. ....................... 330/124 R; 330/295; 330/53
(58) Field of Classification Search ............. 330/124 R, 330/295, 53
See application file for complete search history.

(56) References Cited

U.S. PATENT DOCUMENTS

| | | | | |
|---|---|---|---|---|
| 5,786,727 A | * | 7/1998 | Sigmon ..................... | 330/124 R |
| 7,071,775 B2 | * | 7/2006 | Gailus et al. .............. | 330/124 R |
| 7,221,219 B2 | * | 5/2007 | Hellberg et al. .......... | 330/124 R |
| 7,268,617 B2 | * | 9/2007 | Kijima ...................... | 330/124 R |
| 7,382,186 B2 | * | 6/2008 | Apel et al. ................. | 330/129 |
| 2011/0068865 A1 | * | 3/2011 | Mohamadi et al. ....... | 330/124 R |

FOREIGN PATENT DOCUMENTS

| | | |
|---|---|---|
| CN | 1833358 | 9/2006 |
| CN | 101350599 | 1/2009 |
| CN | 101534093 | 9/2009 |
| CN | 201398178 Y | 2/2010 |
| JP | 2009-055515 | 3/2009 |

* cited by examiner

*Primary Examiner* — Patricia Nguyen
(74) *Attorney, Agent, or Firm* — Workman Nydegger

(57) ABSTRACT

The invention relates to a final stage three-way power combining amplifying circuit applied to power amplifier of a mobile communications base station system. The circuit includes at least a first power divider, a power combiner, a Doherty amplifier and a Class AB amplifier, as well as some transmission lines and phase-shift lines. A first output port of the first power divider is connected to a first input port of the power combiner via a first phase-shift line and the Doherty amplifier by concatenating them with transmission lines. A second output port of the first power divider is connected to an input terminal of a Class AB amplifier via a transmission line, an output terminal of the Class AB amplifier is connected to a second input port of the power combiner via a microstrip line, and the output terminal of the power combiner outputs an amplified radio frequency signal. The invention can meet the requirements of both high efficiency and low cost. Meanwhile, the reliability and stability of the power amplifying circuit are also ensured.

12 Claims, 2 Drawing Sheets

FINAL STAGE THREE-WAY POWER COMBINING AMPLIFYING CIRCUIT APPLIED TO POWER AMPLIFIER OF MOBILE COMMUNICATIONS BASE STATION SYSTEM

TECHNICAL FIELD

The invention relates to a power combining amplifying circuit, and particularly, the invention relates to a final stage three-way power combining amplifying circuit applied to a power amplifier of a mobile communications base station system.

BACKGROUND

Nowadays the Doherty technique is a high efficiency technique widely used in power amplifiers for communications frequency bands. Typically, for a given peak-to-average power ratio, there won't be much margin in selection of transistors to achieve an optimum efficiency. The output power of a particular transistor is substantially fixed, which results in the phenomenon that an odd number of transistors are needed for power combining in some designs. Although the multi-transistor (including an odd number of transistors) Doherty power combining technique, especially the Doherty power amplifier technique realized with an odd number of transistors, was referenced in a lot of technical literature, it has been found that the production consistency of Doherty power amplifiers realized with an odd number of transistors is poor in practical application.

SUMMARY

The technical problem to be resolved by the invention is to provide a final stage three-way power combining amplifying circuit applied to a power amplifier of a mobile communications base station system, which has good production consistency and stability, and operates reliably and efficiently.

To resolve the above technical problem, a final stage three-way power combining amplifying circuit applied to a power amplifier of a mobile communications base station system provided according to the invention includes: NO. 1 power divider, a Doherty amplifier, a Class AB amplifier, NO. 1 phase-shift line, and a power combiner. The first output of the NO. 1 power divider is connected to the input of the NO. 1 phase-shift line via a transmission line, the output of the NO. 1 phase-shift line is connected to the input of the Doherty amplifier, and the output of the Doherty amplifier is connected to the first input of the power combiner via a transmission line. The second output of NO. 1 power divider is connected to the input of the Class AB amplifier via a transmission line, the output of the Class AB amplifier is connected to the second input of the power combiner via a transmission line, and the output of the power combiner outputs the amplified radio frequency (RF) signal.

Further, the Doherty amplifier includes NO. 2 power divider, a carrier amplifier, a peak amplifier, NO. 2 phase-shift line and an impedance transformer network. The first output of the NO. 2 power divider is connected to the input of the impedance transformer network via the carrier amplifier and the NO. 2 phase-shift line in concatenation, the second output of NO. 2 power divider is connected to the input of the impedance transformer network via the peak amplifier, and the output of the impedance transformer network is connected to the first input of the power combiner. The carrier amplifier operates in Class AB and the peak amplifier operates in Class C.

Further, an amplified signal input to the Doherty amplifier, after being divided by NO. 2 power divider, passes through the carrier amplifier, NO. 2 phase-shift line and the peak amplifier, respectively and is combined at the input of the impedance transformer network, and the combined two-way signals have the same phase.

Further, the impedance transformer network is constructed by a microstrip line or by a resistance-capacitance network formed of a capacitor and a microstrip line.

Further, the NO. 1 power divider divides a signal input to the NO. 1 power divider into two-route signals which are equal in amplitude but out of phase by 90°, or two-route signals which have an amplitude ratio of 1:2 and are out of phase by 90°.

Further, the NO. 1 power divider is constructed by a microstrip line or by a stand-alone device.

Further, the NO. 1 power divider may be a Wilkinson power divider constructed by a microstrip line.

Further, the stand-alone device is a 3 dB or 5 dB coupler.

Further, the power combiner is a power combiner with an isolation capability, and the isolation between the first input and the second input is over 15 dB.

Further, the power combiner is a power combining network constructed by a stand-alone device, or a power combining network constructed by a microstrip line and respective resistive and capacitive devices.

Further, the stand-alone device is a 3 dB or 5 dB coupler.

Further, the Class AB amplifier is a power back-off type amplifier that may operate in Class A, Class AB or Class B.

In application of the invention, a high efficiency amplifier constituted by N power amplifying circuits according to the invention that perform power combining jointly can be used, where the N is an integer.

The signal input to the NO. 1 power divider can change the divided power according to the variation of gains of the Doherty amplifier and the Class AB amplifier, and attenuators and the like can be inserted as a mechanism of gain adjustment where it is acceptable.

To achieve a high efficiency, the Doherty combing technique is utilized in the invention, which enables the operation efficiency of the power amplifying circuit in the invention to be up to 40%. The overall efficiency of a CDMA or a WCDMA multiple carrier power amplifier that uses the power amplifying circuit in the invention as its final stage amplifying circuit can go beyond 35%. Since the high efficiency amplifier in the invention carry out a balanced power combining by use of a Doherty amplifier and a Class AB amplifier, the production consistency and stability of the high efficiency amplifier in the invention can be ensured. In case of an average output power of 85 W (4 carriers) by a power amplifier, with the assistance of an additional DPD (Digital Pre-Distortion) compensation circuit, the overall linearity performance of the power amplifier is: 750 KHZ<−60 dBc, 1.98 MHZ<−65 dBc, and spurious emission at 4 MHZ, 6.4 MHZ and 16 MHZ<−36 dBm, the overall efficiency of the power amplifier is over 35%. The power amplifying circuit operates reliably and stably after high and low temperature testing and reliability testing. It can be used as the final stage amplifying circuit for a power amplifier of a mobile communications base station.

Advantages of the invention: High efficiency power combination (overall efficiency beyond 35%) is enabled by combination of a Doherty amplifier and a traditional Class AB amplifier, meanwhile, production consistency and operational reliability and stability can be ensured.

DETAILED DESCRIPTION

The invention will be further explained with reference to accompanying drawings and examples to enable engineers of this field to better understand the invention and practice it, but the examples described herein should not be construed as limitations on the invention.

Figure 1:
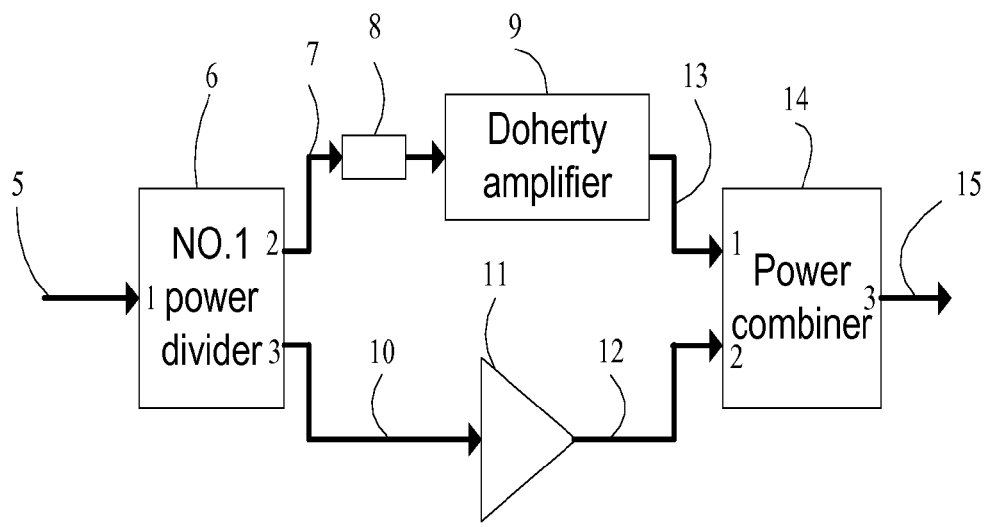
FIG. 1 is a schematic block diagram of a final stage three-way power combining amplifying circuit applied to a power amplifier of a mobile communications base station system in the invention.

As illustrated in FIG. 1, the final stage three-way power combining amplifying circuit applied to a power amplifier of a mobile communications base station system in the invention includes at least NO. 1 power divider 6, a power combiner 14, a Doherty amplifier 9 and a Class AB amplifier 11, as well as the NO. 1 phase-shift line and some transmission lines. In case of independent application of the circuit, the first output of the NO. 1 power divider 6 is connected to an input of the NO. 1 phase-shift line 8 via a transmission line 7, the output of the NO. 1 phase-shift line 8 is connected to the input of the Doherty amplifier 9, and the output of the Doherty amplifier 9 is connected to the first input of the power combiner 14 via a transmission line 13. The second output of the NO. 1 power divider 6 is connected to the input of the Class AB amplifier 11 via a transmission line 10, the output of the Class AB amplifier 11 is connected to the second input of the power combiner 14 via a transmission 12, and the output of the power combiner outputs an amplified radio frequency signal 15.

The NO. 1 power divider 6 can be implemented in many ways which can be selected depending on a specific application context. It can be constructed by a microstrip line, such as a Wilkinson power divider constructed by a microstrip line, or it can be implemented with a stand-alone device, such as a (0, −90°) 3 dB or 5 dB coupler. The main function of the NO. 1 power divider 6 is to divide the signal input to the NO. 1 power divider 6 into two-route signals. The two-route signals may be equal in amplitude but out of phase by 90°, or have an amplitude ratio of 1:2 and are out of phase by 90°. The two-route signals may also be equal in phase but have another amplitude ratio, as long as the two-route signals to be combined at the final combing point have the same phase. The power combiner 14 is a power combiner with an isolation capability, and the isolation between the two input ports is over 15 dB. The power combiner can be implemented in many ways. For example, it can be a stand-alone device such as a power combining network constructed by a (0°, −90°)3 dB or 5 dB coupler, or it can be a power combining network constructed by a microstrip line and respective resistive and capacitive devices. The main function of the power combiner is to perform an equiphase combination of powers output respectively by the Doherty amplifier 9 and the Class AB amplifier 11. The function of the NO. 1 phase-shift line 8 is phase adjustment to make signals at the first and the second input ports 1,2 of the power combiner 14 have the same phase. The Class AB amplifier is a power back-off type amplifier that may operate in Class A, Class AB or Class B.

Figure 2:
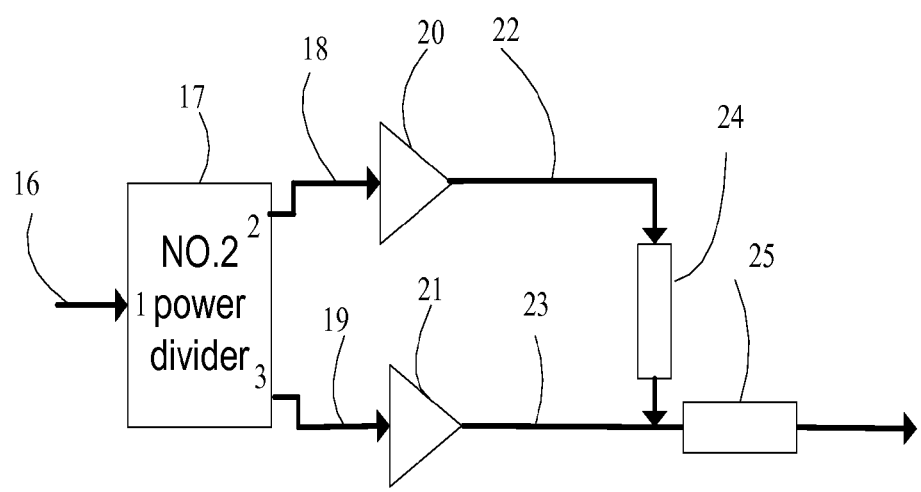
FIG. 2 is a block diagram of an implementation of the Doherty amplifier in the invention.

As illustrated in FIG. 2, the Doherty amplifier in the invention is a traditional Doherty amplifier that includes NO. 2 power divider 17, a carrier amplifier 20, a peak amplifier 21, NO. 2 phase-shift line 24, an impedance transformer network 25, and transmission lines 18, 19, 22 and 23. The first output of the NO. 2 power divider 17 is connected to the input of the carrier amplifier 20 via the transmission line 18, and the output of the carrier amplifier 20 is connected to the input of the NO. 2 phase-shift line 24 via the transmission line 22. The second output of the NO. 2 power divider 17 is connected to the input of the peak amplifier 21 via a transmission line 19, the output of the peak amplifier 21 is combined with the output of the NO. 2 phase-shift line 24 via the transmission line 23 and then connected to the input of the impedance transformer network 25, and the output of the impedance transformer network 25 is connected to the first input of the power combiner 14. The signal 16 is input to the NO. 2 power divider 17, where it is divided into two-route signals. The signal on one route is amplified by the carrier amplifier 20, and then phase-adjusted by the NO. 2 phase-shift line 24. The signal on the other route is amplified by the peak amplifier 21 and then combined with the output signal of the NO. 2 phase-shift line 24 at the input of the impedance transformer network 25. The two combined signals have the same phase, and are finally output through the impedance transformer network 25. In the invention, the carrier amplifier 20 operates in Class AB, and the peak amplifier 21 operates in Class C. Transistor of different process technologies, different frequency bands and different power levels can be selected respectively with respect to the transistors used in the Doherty amplifier 9 and the Class AB amplifier 11. The rating powers of the carrier amplifier 20 and the peak amplifier 21 may or may not be the same. The output power of the carrier amplifier 20 may be higher or lower than that of the peak amplifier 21.

The operation manner of the invention is as follows: A radio frequency signal 5 input to the circuit is divided into two-route signals that may or may not be equal in power, depending on the specific implementation of NO. 1 power divider 6. The phase difference between the two-route signals may be 90° or any other degrees, depending on the specific implementation of NO. 1 power divider 6. The signal on one route is amplified by the Doherty amplifier, and the signal on the other route is amplified by the Class AB amplifier. Finally, the amplified two-route signals are equiphasely power-combined by the power combiner 14.

The invention is based on a traditional power combining architecture, but differs with the traditional power combining architecture in that one route is a Class AB amplifier while the other is a Doherty amplifier. The rating power of the transistor selected for the Class AB amplifier may or may not be the same as that of the two amplifying tubes that construct the Doherty amplifier.

The Doherty amplifier 9 can form a Doherty circuit with two transistors the same as or different with that of the Class AB amplifier 11. However the principle that the output powers of the Doherty amplifier and the Class AB amplifier are equal in a small signal output condition should be followed, and at the same time the phase requirement for power combining must be met to carry out power combining. This is the same as the traditional power combining principle. When outputting peak power, a portion of the power will be lost in power combiner 14 since the saturation output power of the Doherty amplifier is higher than that of the Class AB amplifier 11. As a result, theoretically, the final stage three-way power combining amplifying circuit in the invention can only make a lossless power combining in small signal conditions, but will have some loss at peak power. However by the following derivation it is concluded that the loss at peak power is small enough to be acceptable.

It is assumed that the peak power of the Doherty amplifier 9 is 2 P, and the peak output power of the Class AB amplifier 11 is P. Normalized average voltages distributed to the output of the power combiner 14 by the Doherty amplifier 9 and the Class AB amplifier 11 and consumed in the power combiner 14 are calculated as follows, respectively:

The voltage distributed to the output by the Doherty amplifier $9=\sqrt{P}$;

The voltage distributed to the output by the Class AB amplifier $11=\sqrt{P/2}$;

The voltage distributed to the isolation port by the Doherty amplifier $9=\sqrt{P}$;

The voltage distributed to the isolation port by the Class AB amplifier $11=\sqrt{P/2}$;

Therefore, the power at the output of the power combiner 14 is $P*(1+\sqrt{1/2})=2.914\ P$;

The power consumed by the power combiner itself is $P*(1-\sqrt{1/2})=0.086\ P$;

The 0.086 P power consumed by the power combiner itself will be lost due to absorption of the power combiner 14. This portion of peak power loss is converted to a 0.126 dB peak power loss in dB in relation to the ideal power combination 2 P+P=3 P. However it is noted that there is no power loss in small power combining that occurs with high probability, which can be selected as the average output power of the amplifier in system design. Though there will be a 0.126 dB loss in peak power combining, the probability of occurrence of peak power is relatively low and the loss is also small. As a result, the loss at peak power is acceptable when the above-described circuit is put into engineering applications.

The invention can be widely used in high efficiency, multiple carrier power amplifiers for mobile communications base station system. An specific examples of an 85 W high efficiency, multiple carrier power amplifier used in a CDMA2000 base station system is provided below.

EXAMPLE 1

Figure 3:
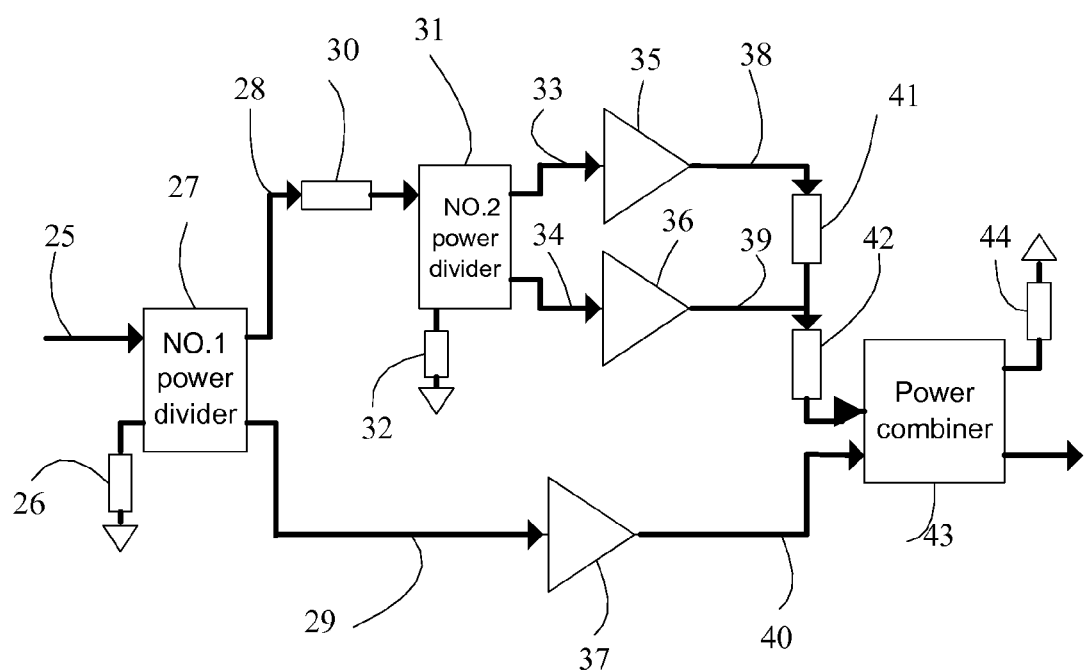
FIG. 3 is a schematic block diagram of an embodiment of the invention.

A four carrier, high efficiency power amplifier with an output power of 85 W and operation frequency bands from 869 to 894 MHz for a CDMA2000 base station (referring to FIG. 3 for schematic block diagram).

The amplifier includes: NO. 1 absorption load 26, NO. 1 power divider 27, NO. 1 transmission line 28, NO. 2 transmission line 29, NO. 1 phase-shift line 30, NO. 2 power divider 31, NO. 2 absorption load 32, NO. 3 transmission line 33, NO. 4 transmission line 34, a carrier amplifier 35, a peak amplifier 36, a Class AB amplifier 37, NO. 5 transmission line 38, NO. 6 transmission line 39, NO. 7 transmission line 40, NO. 2 phase-shift line 41, an impedance transformer network 42, a power combiner 43 and NO. 3 absorption load 44. A signal to be amplified is input to the input of the NO. 1 power divider 27, the isolation port of the NO. 1 power divider 27 is connected to the NO. 1 absorption load 26, the 0° output of the NO. 1 power divider 27 is connected to the input of the NO. 1 phase-shift line 30 via the first transmission line 28, the output of the NO. 1 phase-shift line 30 is connected to the input of the NO. 2 power divider 31, and the isolation port of the NO. 2 power divider 31 is connected to the NO. 2 absorption load 32. The 0° output of the NO. 2 power divider 31 is connected to the input of the carrier amplifier 35 via the NO. 3 transmission line 33, and the −90° output of the NO. 2 power divider 31 is connected to the input of the peak amplifier 36 via the NO. 4 transmission line 34. The output of the carrier amplifier 35 is connected to the input of the NO. 2 phase-shift line 41 via the NO. 5 transmission line 38. The output of the peak amplifier 36 is combined with the output of the NO. 2 phase-shift line 41 via the transmission line 39, and then input to the input of the impedance transformer network 42 after the combining. The output of the impedance transformer network 42 is connected to a −90° input of the power combiner 43. The −90° output of the NO. 1 power divider 27 is connected to the input of the Class AB amplifier 37 via the NO. 2 transmission line 29, and the output of the Class AB amplifier 37 connected to the 0° input of the power combiner 43 via the NO. 7 transmission line 40. An isolation port of the power combiner 43 is connected to the NO. 3 absorption load 44, and finally the amplified signal is output from the output of the power combiner 43.

Among them, the (0°, −90°)3 dB coupler XC0900E-3S from ANAREN is selected for the NO. 1 power divider 27 and the NO. 2 power divider 31. MRFE6S9125NR1 or MRFE6S9125NBR1 from Freescale is selected for transistors of the carrier amplifier 35 and the peak amplifier 36 which form the Doherty amplifier. MRF5S9101N from Freescale is selected for the Class AB amplifier 37. The coupler XC0900A-3S from ANAREN is selected for use in the power combiner 43. The phase-shift lines are implemented by microstrip lines of a certain width and length.

EXAMPLE 2

A four carrier, high efficiency power amplifier with an output power of 85 W and operation frequency bands from 2110 to 2170 MHz for a WCDMA2000 base station (referring to FIG. 3 for schematic block diagram). The implementation is substantially the same as example 1.

Among them, The (0°, −90°)3 dB coupler XC2100E-3S from ANAREN is selected for the NO. 1 power divider 27 and the NO. 2 power divider 31. BLF6G22LS-130 from NXP is selected for the transistor of the carrier amplifier 35 and, BLF6G22LS-180 from NXP is selected for the transistor of the peak amplifier 36, which form the Doherty amplifier with the carrier amplifier 35. MRF7S21170HR from Freescale is selected for the transistor of the Class AB amplifier 37. The coupler XC2100A-3S from ANAREN is selected for use in the power combiner 43. The phase-shift lines are implemented by microstrip lines of a certain width and length.

The above examples are only preferred examples provided to fully explain the invention, and the scope of the invention is not limited thereto. Equivalent replacement or modification made by engineers of this field on basis of teachings of the invention all fall within the scope of the invention. The scope of the invention is only defined by appended Claims that follow.

What is claimed is:

1. A final stage three-way power combining amplifying circuit applied to power amplifier of a mobile communications base station system, comprising:

No. 1 power divider, a Doherty amplifier, a Class AB amplifier, No. 1 phase-shift line, and a power combiner, wherein The first output of the No. 1 power divider is connected to the input of the No. 1 phase-shift line via a transmission line, the output of the No. 1 phase-shift line is connected to the input of the Doherty amplifier, and the output of the Doherty amplifier is connected to the first input of the power combiner via a transmission line, and wherein The second output of the No. 1 power divider is connected to an input of the Class AB amplifier via a transmission line, the output of the Class AB amplifier is connected to the second input of the power combiner via a transmission line, and the output of the power combiner outputs an amplified radio frequency signal.

2. The final stage three-way power combining amplifying circuit applied to power amplifier of a mobile communications base station system of claim 1, wherein the Doherty amplifier comprises No. 2 power divider, a carrier amplifier, a peak amplifier, No. 2 phase-shift line and an impedance transformer network, the first output of the No. 2 power divider is connected to the input of the impedance transformer network via the carrier amplifier and the No. 2 phase-shift line in concatenation, the second output of the No. 2 power divider is connected to the input of the impedance transformer network via the peak amplifier, the output of the impedance transformer network is connected to the first input of the power combiner, and wherein, the carrier amplifier operates in Class AB and the peak amplifier operates in Class C.

3. The final stage three-way power combining amplifying circuit applied to power amplifier of a mobile communications base station system of claim 2, wherein an amplified signal input to the Doherty amplifier, after being divided by the No. 2 power divider, passes through the carrier amplifier, the No. 2 phase-shift line and the peak amplifier, respectively and is combined at the input of the impedance transformer network, and the combined two-route signals have the same phase.

4. The final stage three-way power combining amplifying circuit applied to power amplifier of a mobile communications base station system of claim 2, wherein the impedance transformer network is constructed by a microstrip line or by a resistance-capacitance network formed of a capacitor and a microstrip line.

5. The final stage three-way power combining amplifying circuit applied to power amplifier of a mobile communications base station system of claim 1, wherein the No. 1 power divider divides a signal input to the first power divider into two-route signals which are equal in amplitude but out of phase by 90°, or two-route signals which have an amplitude ratio of 1:2 and are out of phase by 90°.

6. The final stage three-way power combining amplifying circuit applied to power amplifier of a mobile communications base station system of claim 1, wherein the No. 1 power divider is constructed by a microstrip line or by a stand-alone device.

7. The final stage three-way power combining amplifying circuit applied to power amplifier of a mobile communications base station system of claim 6, wherein the No. 1 power divider is a Wilkinson power divider constructed by a microstrip line.

8. The final stage three-way power combining amplifying circuit applied to power amplifier of a mobile communications base station system of claim 6, wherein the stand-alone device is a 3 dB or 5 dB coupler.

9. The final stage three-way power combining amplifying circuit applied to power amplifier of a mobile communications base station system of claim 1, wherein the power combiner is a power combiner with an isolation capability, and wherein the isolation between the first input port and the second input port is over 15 dB.

10. The final stage three-way power combining amplifying circuit applied to power amplifier of a mobile communications base station system of claim 1, wherein the power combiner is a power combining network constructed by a stand-alone device, or a power combining network constructed by a microstrip line and respective resistive and capacitive devices.

11. The final stage three-way power combining amplifying circuit applied to power amplifier of a mobile communications base station system of claim 10, wherein the stand-alone device is a 3 dB or 5 dB coupler.

12. The final stage three-way power combining amplifying circuit applied to power amplifier of a mobile communications base station system of claim 1, wherein the Class AB amplifier is a power back-off type amplifier that operates in one of Class A, Class AB or Class B.

* * * * *